(12) United States Patent
Adetutu et al.

(10) Patent No.: US 6,369,430 B1
(45) Date of Patent: Apr. 9, 2002

(54) METHOD OF PREVENTING TWO NEIGHBORING CONTACTS FROM A SHORT-CIRCUIT CAUSED BY A VOID BETWEEN THEM AND DEVICE HAVING THE SAME

(75) Inventors: Olubunmi O. Adetutu; Yeong-Jyh T. Lii; Paul A. Grudowski, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/823,310

(22) Filed: Apr. 2, 2001

(51) Int. Cl.$^7$ .................. H01L 29/76; H01L 23/48; H01L 21/8238; H01L 21/76; H01L 21/4763

(52) U.S. Cl. .............. 257/382; 257/383; 257/773; 257/774; 438/233; 438/283; 438/533; 438/421; 438/422; 438/586; 438/597; 438/619

(58) Field of Search ................. 438/305, 233, 438/421, 422, 619, 411, 319, 128, 157, 195, 257, 283, 523, 533, 586, 597; 257/202–206, 584, 383, 588, 587, 690, 382, 503, 773, 774

(56) References Cited

U.S. PATENT DOCUMENTS

| 6,184,073 B1 | 2/2001 | Lage et al. ............. 438/238 |
| 6,228,731 B1 * | 5/2001 | Liaw et al. ............. 438/303 |
| 6,274,426 B1 * | 8/2001 | Lee et al. ............... 438/253 |

* cited by examiner

*Primary Examiner*—Ha Tran Nguyen
(74) *Attorney, Agent, or Firm*—Kim-Marie Vo; James L. Clingan, Jr.

(57) ABSTRACT

Insulating layers between transistors that are very close together may have voids. When contacts are formed in these areas between these close transistors, the contact hole is formed at the void location. These voids may extend between the contact locations that are close together so that the deposition of the conductive material into these contact holes may extend sufficiently into the void to short two such contacts. This is prevented by placing a liner in the contact hole, which constricts the void size in the contact hole, prior to depositing the conductive material. This restricts ingress of conductive material into the void. This prevents the void from being an unwanted conduction path between two contacts that are in close proximity. The bottoms of the contact holes are etched to remove the liner prior to depositing the conductive material.

14 Claims, 6 Drawing Sheets

METHOD OF PREVENTING TWO NEIGHBORING CONTACTS FROM A SHORT-CIRCUIT CAUSED BY A VOID BETWEEN THEM AND DEVICE HAVING THE SAME

FIELD OF THE INVENTION

This invention pertains, in general, to semiconductor processing and, more specifically, to forming an integrated circuit device with a contact hole.

BACKGROUND OF THE INVENTION

Interconnect technology is a factor in the ability to reduce the area of integrated circuit devices. Multi-level metallization layouts have assisted dimension shrinkage by having multiple metal lines share the same area of the device. In a multi-level metallization layout, a dielectric layer, termed an interlevel dielectric layer (ILD) or a pre-metal dielectric (PMD) layer, is formed between the first metal layer and the transistors. Typically, the dielectric layer is formed to isolate the metal layer from the transistors. To electrically connect the underlying gate of the transistors or the substrate (i.e. the source or drain region) to the first metal line, a contact hole is etched within the ILD layer and filled with a conductive material to form a contact plug. Typically, a contact hole is formed between two transistors. These contact holes are desirably small so the transistors may be close together but must also be reliable. There, thus, is a need for contacts that are reliable and allow for transistors to be close together.

BRIEF DESCRIPTION OF THE DRAWINGS

The present invention is illustrated by way of example and is not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 11:
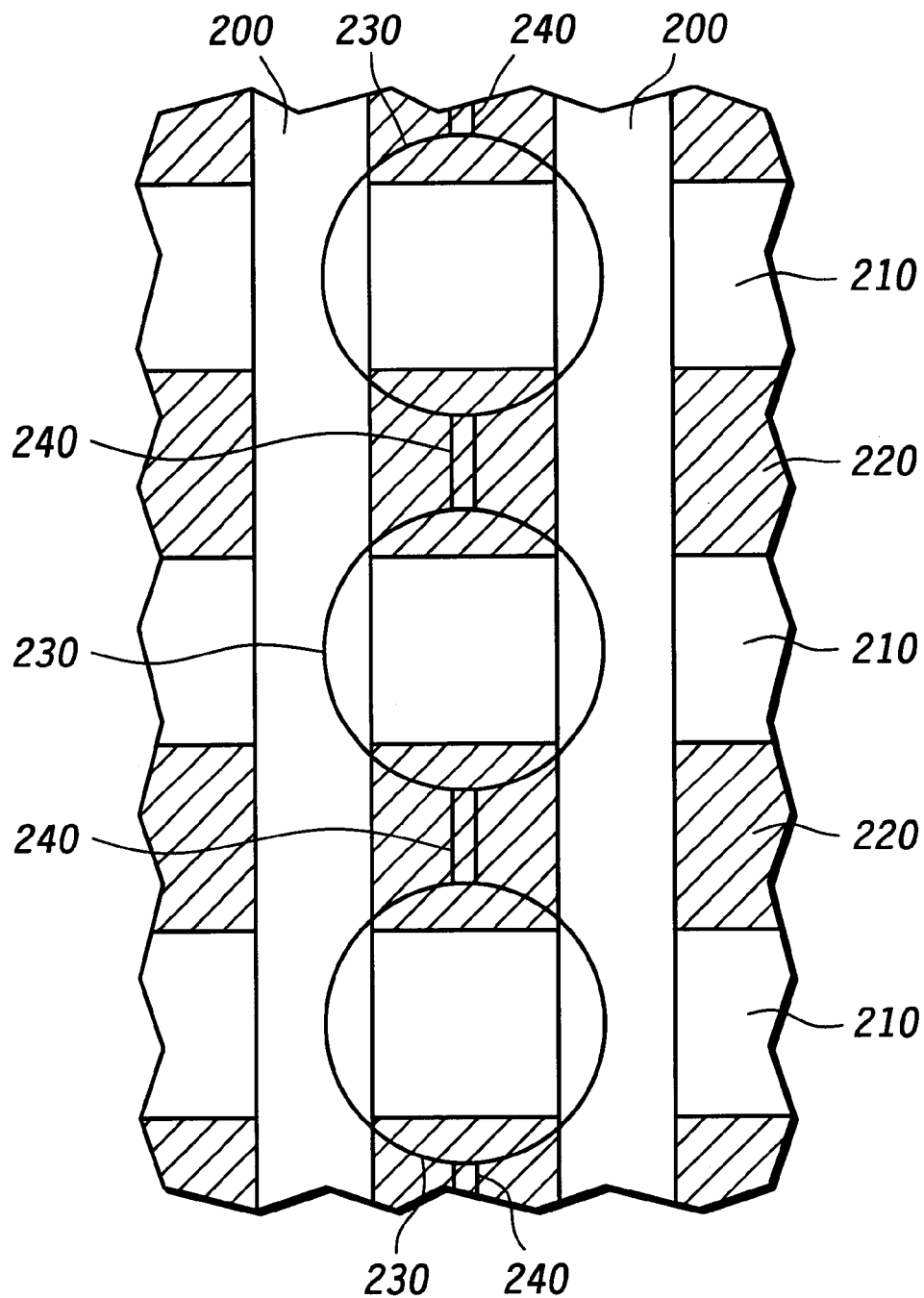
FIG. 11 illustrates a top view of a portion of a semiconductor substrate in accordance with the present invention.

In integrated circuits as device dimensions shrink, the distance between transistors decreases. When depositing thick layers over the substrate, it is possible to form voids in this layer, between the transistors. This occurs because the aspect ratio of the height of the transistor stack (gate oxide, gate electrode and capping layer) and the deposited layer to the distance between the transistors is too great. In other words, the deposited layer does not completely fill the area between the transistors due to the dimensions of the area. An example of an aspect ratio that will typically result in a void is approximately 3 to 1. The inventors have discovered that if the void is formed where a contact plug will later be formed, it is possible for the metal layer within the contact plug to substantially fill the void and cause an undesirable short. Since the void 240 often extends from one active area 210 to another active area 210, as shown in FIG. 11, it is possible for the metal layer to form a stringer if the metal substantially fills the void. Undesirably, the stringer shorts contacts 230, and, thus, the active areas 210 together. Thus, it is necessary to prevent the metal from substantially filling void 240. Applicants have discovered that by forming a liner layer, which is preferably deposited by chemical vapor deposition (CVD), within the contact opening, the opening of the void can be blocked, thereby, preventing the stringer from being formed. The present invention is better understood by turning to the figures.

Figure 1:
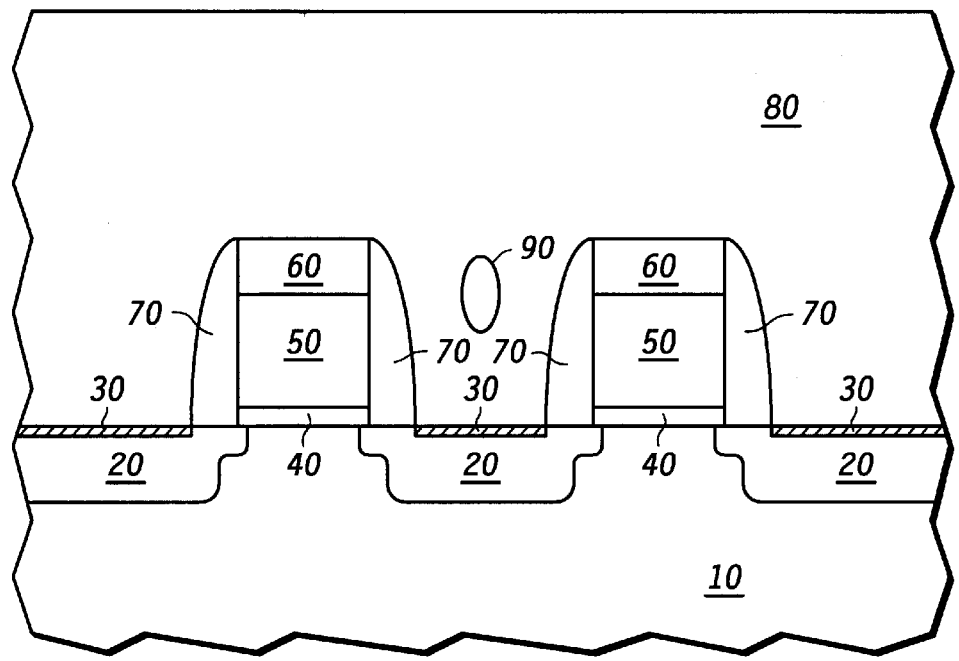
FIGS. 1 and 2 are cross-sections of a portion of a semiconductor substrate illustrating voids in accordance with the present invention.

FIG. 1 illustrates, in a first direction, void 90 is formed as a result of two transistors being close together, which Applicants have discovered. Doped regions 20, such as source and drains, are formed within semiconductor substrate 10. Substrate 10 can be monocrystalline or polycrystalline silicon, gallium arsenide, germanium, silicon-on-insulator (SOI), and the like. In the preferred embodiment, the substrate 10 is monocrystalline silicon and doped regions 20 are formed by ion implantation. For example, doped regions 20 can be formed by doping substrate 10 with phosphorus, boron, or arsenic depending on the conductivity type required. Within doped regions 20, silicide regions 30 are formed using conventional processing. Gate dielectric 40 can be $SiO_2$, a mid-k dielectric, such as $SiO_xN_y$ and silicon nitride, or a high K dielectric material such as $ZrO_2$, $HfO_2$ and silicates. Gate electrode 50 is formed over gate dielectric 40 and is, typically, polysilicon. In other embodiments, gate electrodes can comprise a metal. Spacers 70 and capping layer 60 are, typically, dielectric materials. For example, they can be silicon nitride. Spacer 70 and capping layer 60 may or may not be the same material. Optionally, an etch stop layer (ESL) can be formed over substrate 10. Any insulator with an etch selectivity to the subsequently formed ILD of less than 1 to 1 can be used for the ESL.

In one embodiment, the ESL is a 500 Angstrom thick nitride. Interlevel dielectric layer (ILD) 80, an insulating fill, is deposited over substrate 10. Preferably, ILD layer 80 is nitride silicate glass oxide, undoped silicate glass oxide, SOG oxide, metal oxide, and more preferably, undoped TEOS (tetraethylorthosilicate) oxide. It is desirable to dope ILD layer 80, because a doped oxide is, generally, easier to etch. Also, the doped oxide getters defects that can degrade the underlying transistors. In one embodiment, the distance between the two shown transistors is approximately 100 nanometers and the thickness of the transistor stack and ILD layer 80 is approximately 300 nanometers, resulting in an aspect ratio of approximately 3 to 1. Void 90 is formed during the deposition of ILD layer 80 due to the high aspect ratio of the area between the transistors. Although only two transistors are shown in FIG. 1, more transistors are usually formed. For example, at least two additional transistors are formed in a row either behind or in front of the two shown transistors in FIG. 1. THE two illustrated silicide regions 30 within shared doped regions 20 separate two pairs of transistors, each pair sharing doped regions 20.

Figure 2:
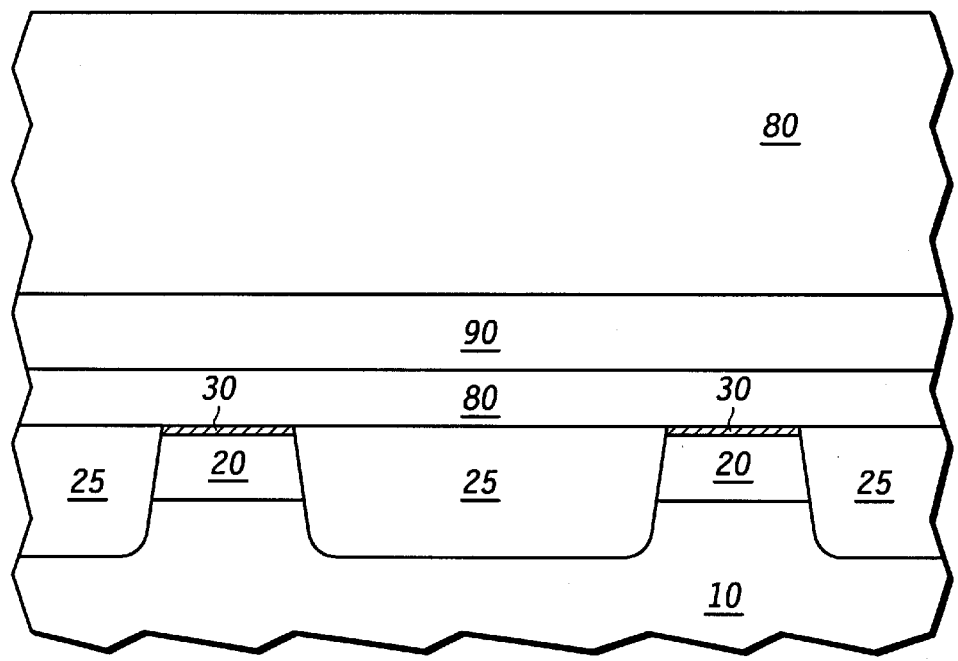

FIG. 2 illustrates a cross-section in a second direction, which is along the void. The presence of void 90 extending in a second direction, which is perpendicular to the first direction, is shown within ILD layer 80.

Figure 3:
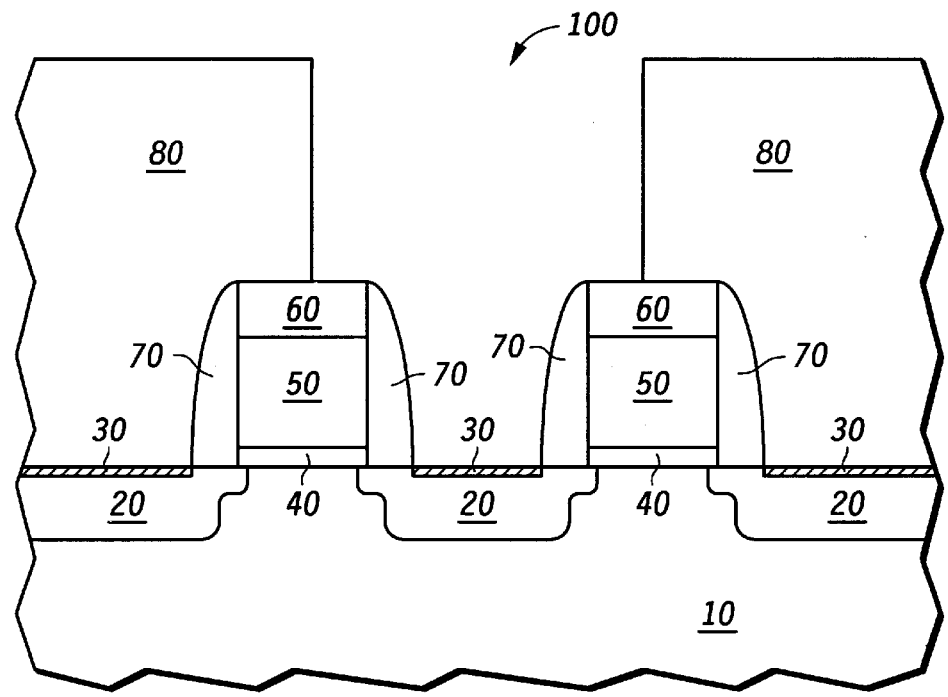
FIGS. 3 and 4 are a portion of a semiconductor substrate illustrating forming an opening in accordance with the present invention.
Figure 4:
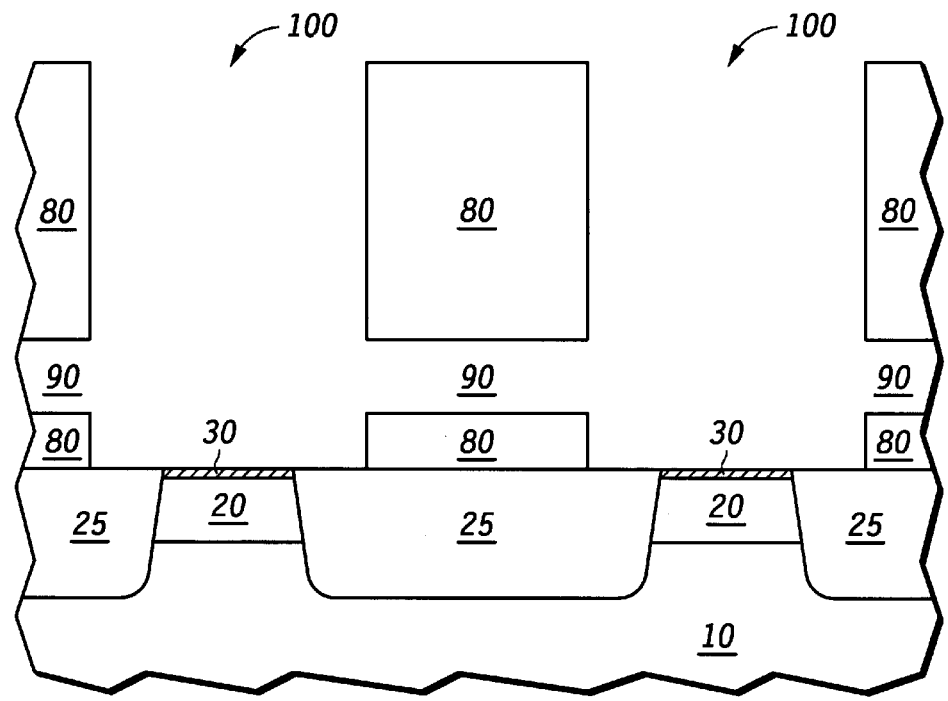

A photoresist layer (not shown) is deposited over ILD layer 80 of FIGS. 1 and 2 and patterned for contact holes having sidewalls and bottoms. Contact hole 100 is then etched within ILD layer 80 between the two shown transistors of FIG. 1 and over a first shared doped region, resulting in the cross-sections of FIGS. 3 and 4. Although void 90 is not shown in FIG. 3, it still exists. As shown in FIG. 4, void 90 undesirably connects the contact holes 100 over the first shared dope region 20 and second shared doped region 20 shared by two other transistors.

Figure 5:
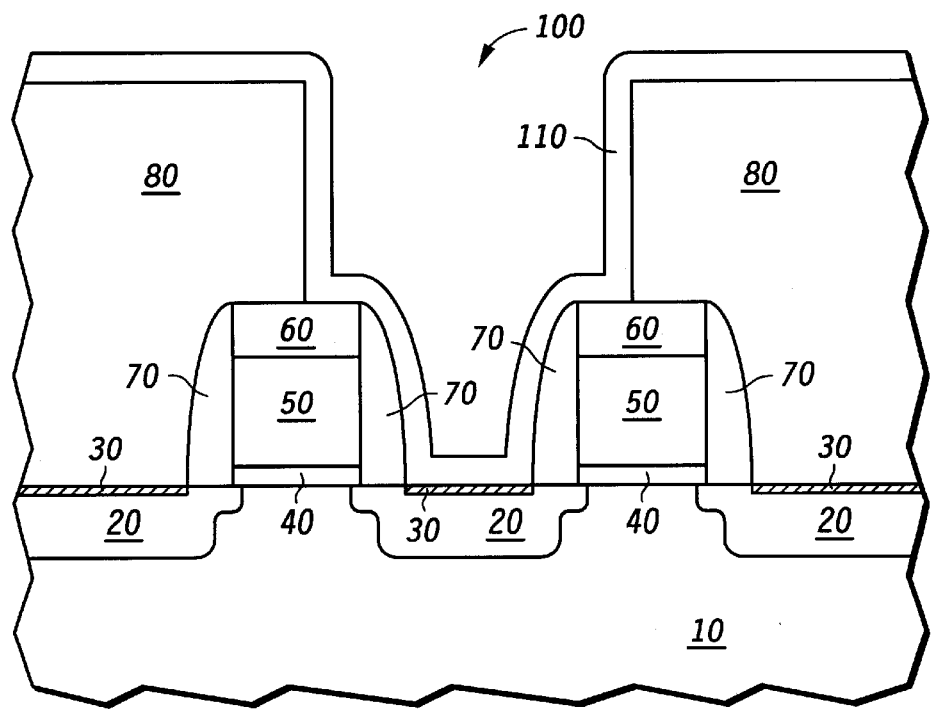
FIGS. 5 and 6 illustrate a portion of the semiconductor substrate showing a first liner layer in accordance with the present invention.
Figure 6:
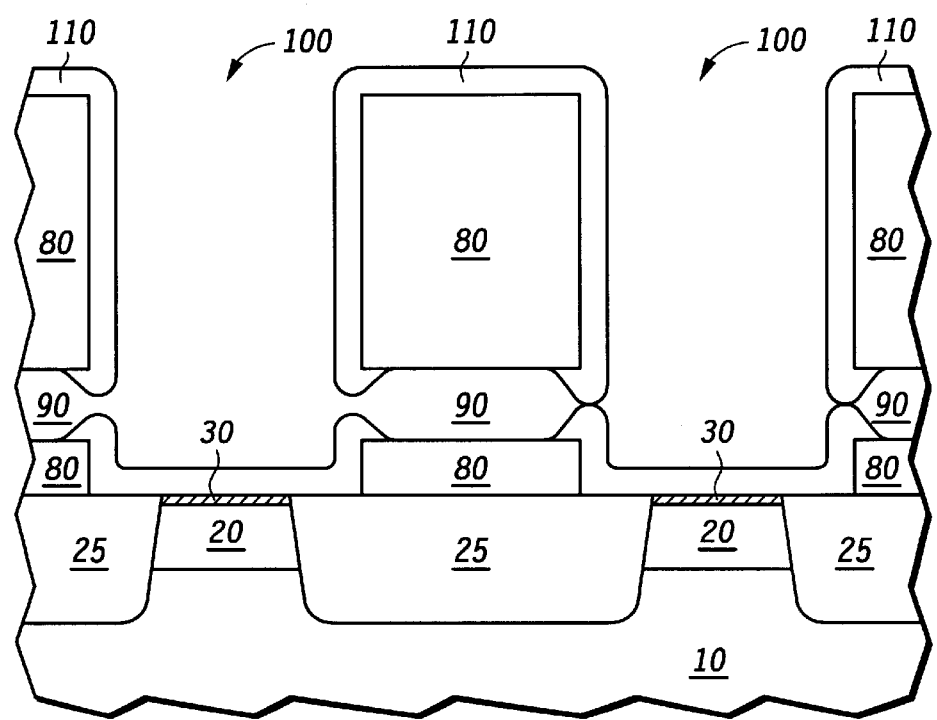

Shown in FIGS. 5 and 6 is a structure resulting from liner layer 110 being deposited within contact hole 100 as a prevention means for preventing the subsequently formed conductive material from extending between the contact holes through the void or to constrict the exposed void. Liner layer 110 can be a conductive material or a dielectric material such as an oxide, a spin-on-glass (SOG), metal oxide, or a nitride layer. Liner layer 110 can be formed by chemical vapor deposition (CVD), plasma enhanced chemical vapor deposition (PECVD), atomic layer deposition (ALD) and the like. Physical vapor deposition (PVD), however, is less desirable because PVD films, generally, will not sufficiently constrict exposed void 90. In a preferred embodiment, liner layer 110 is undoped TEOS formed by PECVD, to keep the thermal budget low. The thickness of liner layer 110 is at most approximately half of the width of contact hole 100 or, more preferably, is approximately ten percent of the contact hole. A 100 Angstrom liner layer has been shown to be sufficient within a 1000 Angstrom wide contact hole.

As shown in FIG. 6, liner layer 110 may extend into void 90. Liner layer 110 should decrease the size of the opening to void 90, and may completely cover the opening of void 90. Both are sufficient for preventing subsequently formed metal layer from filling void 90, as will be further explained.

Figure 7:
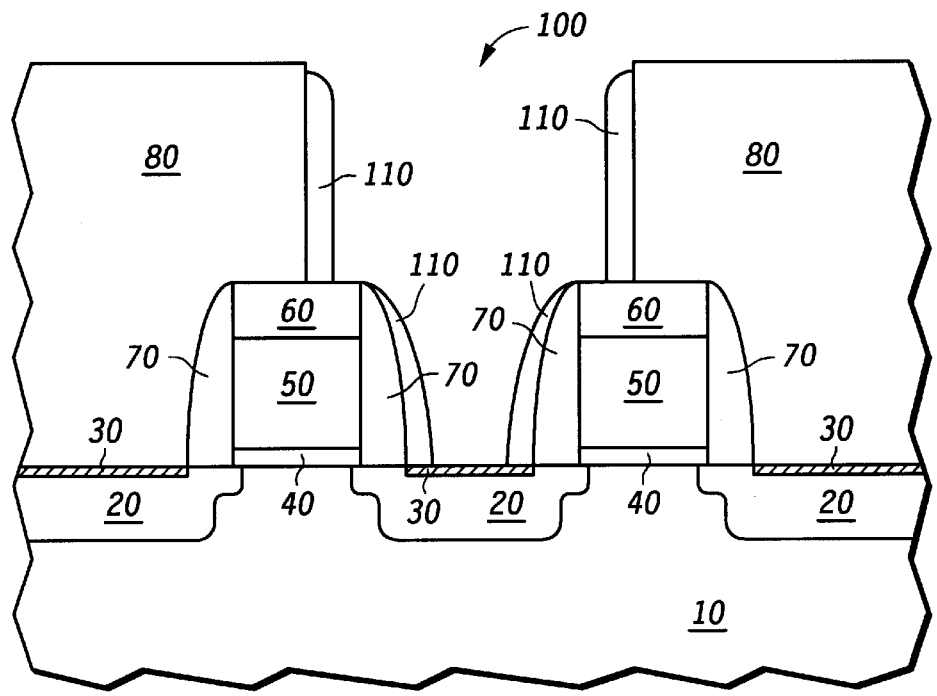
FIGS. 7 and 8 show a portion of a semiconductor substrate after etching the first liner layer in accordance with the present invention.
Figure 8:
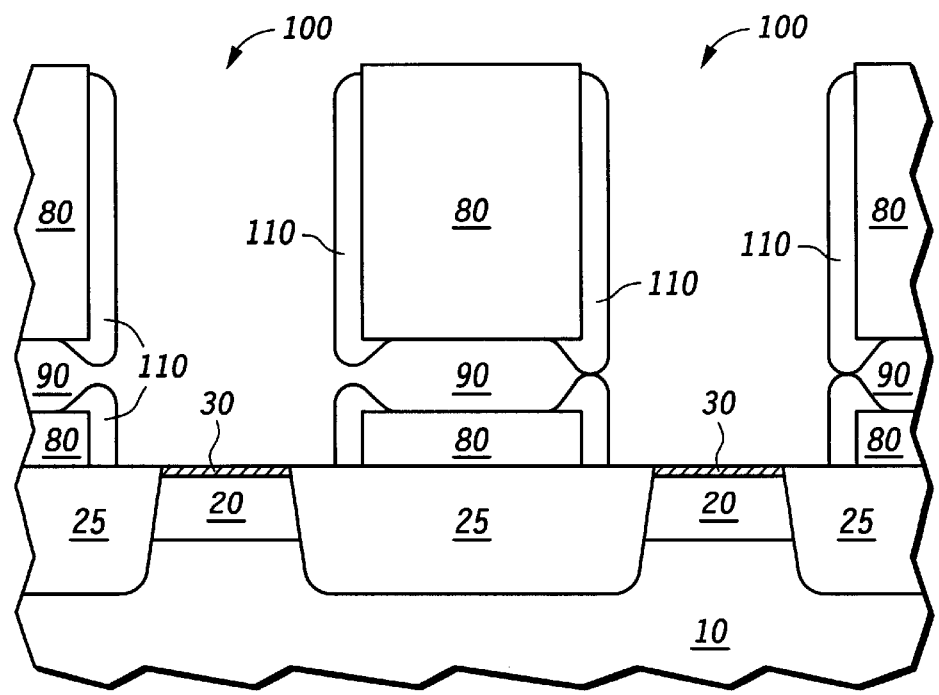

After depositing liner layer 110, a portion of liner layer 110 may be subsequently removed in order to expose silicide region 30 that lies between the two transistors. If liner layer 110 is a conductive material, a portion of liner layer need not be removed. If, however, liner layer 110 is a nonconductive material, then a portion of liner layer 110 may need to be removed in order to form an electrical connection between the subsequently formed metal layer and a conductive portion of the substrate, such as the silicide region or active region between the transistors. In one embodiment, a dry etch, typically used to etch the material chosen for liner layer 110, is used to remove a portion liner layer 110 to expose silicide region 30, as shown in FIG. 7. The removal process should be anisotropic in order to leave liner layer 110 substantially covering the vertical sidewalls of contact hole 100, as shown in FIG. 8. However, any other process that removes liner layer 110 from the bottom of the contact hole and does not remove a significant portion of the liner layer covering void 90 can be used. Hence, liner layer 110 reduces the size of the opening of void 90 so that a conductive layer cannot form a stringer in the void. In one embodiment, liner layer 110 reduces the size of the opening so much that there is no longer an opening.

If the subsequently formed metal layer 130 does not either adhere to liner layer 110 sufficiently or does not have a desired contact resistance, second liner layer 120 may need to be formed. Second liner layer 120 can be a single material or could be a stack of materials. In the event that second liner layer 120 is a stack of materials, one material or group of materials could be chosen because of the good adhesion properties to the liner layer 110 and/or subsequently formed metal layer 130. The other material or materials in the stack may be chosen because they decrease the contact resistance of the overall conductive plug after metal layer 120 is formed. Second liner layer 120 can be formed by PVD, CVD, metal organic chemical vapor deposition (MOCVD), ALD, any combination of the above, and the like. Any refractory metal or refractory metal nitride such as titanium nitride, titanium, tantalum, tantalum nitride, tungsten nitride (WN, $W_2N$), can be used for second liner layer 120 either alone or in combination.

Figure 9:
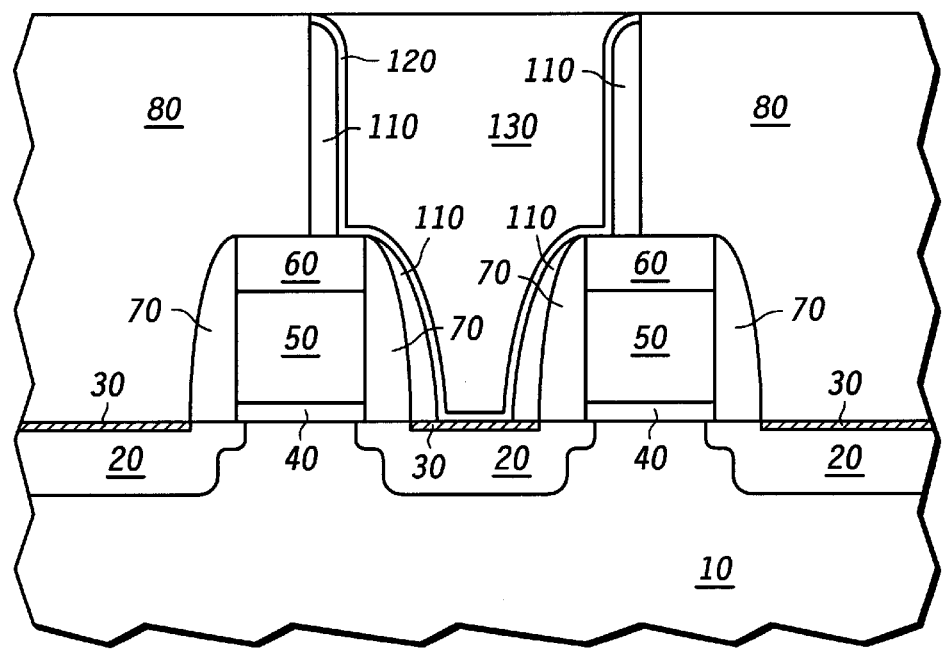
FIGS. 9 and 10 illustrate a portion of a semiconductor substrate with an adhesion layer and metal layer in the contact opening as in accordance with the present invention.
Figure 10:
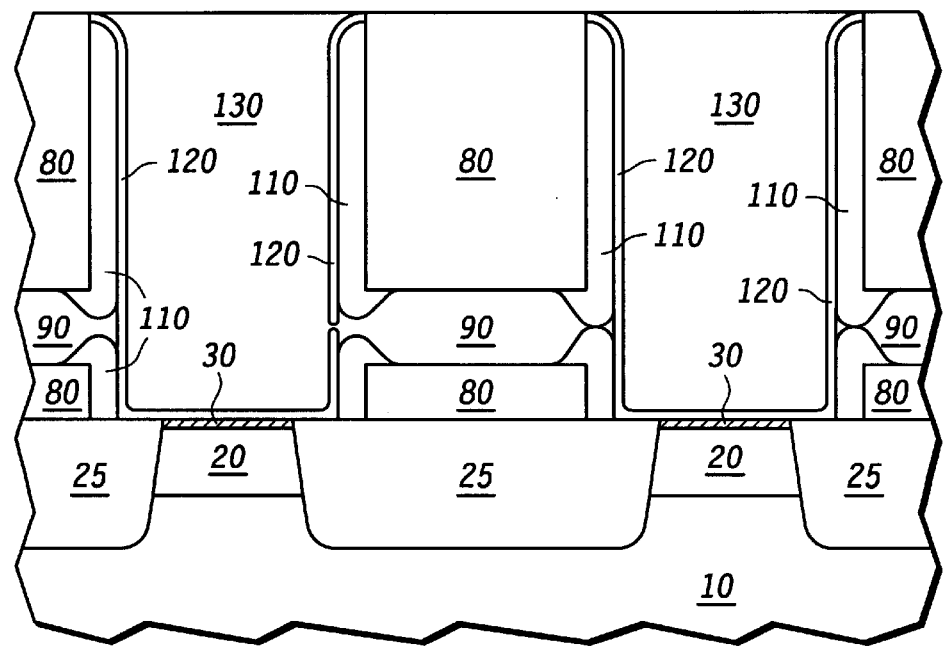

After second liner layer 120 is deposited, metal layer 130 is formed. Metal layer 130 can be formed by CVD, PVD, ALD, combinations of the above, or the like. Any metal material can be used for a metal layer, preferably tungsten, aluminum or copper is used. If aluminum is used, a reflow may need to be performed after deposition of metal layer 130. Metal layer 130 is approximately 1,000 to 10,000 angstroms thick or more preferably approximately 1,500 to 5,000 Angstroms in thickness. To planarize metal layer 130 and remove second liner layer 120 from the top surface of ILD layer 80, a chemical mechanical polishing process is used. In another embodiment, metal layer 130 and portions of second liner layer 120 are etched back to produce the structure shown in FIG. 9. As shown in FIG. 10, second liner layer 120 may or may not decrease the opening of void 90. In addition, portions of second liner layer 120 may actually fill the hole opening left by liner layer 110. Regardless, first liner layer 110 and second liner layer 120 prevent metal layer 130 from substantially filling void 90 and, thus, shorting of the contact holes is avoided. In many of the mentioned cases, metal layer 130 does not substantially fill void 90 and thus does not short the contact holes.

FIG. 11 shows a top view of a portion of a semiconductor substrate after the process described in regards to FIGS. 1–10. The gate stack or transistors are located at the intersection of void lines 200 and active areas 210. Active areas 210 are separated from each other by isolation regions 220. Contacts 230 comprise metal layer 130, second liner layer 120 and liner layer 110. Contacts 230 are connected by voids 240. If contact 230 does not comprise liner layer 110, voids 240 will be filled with metal layer 130 and thus create stringers which short active areas 210 to each other.

The liner layer previously described may be used for other reasons than substantially covering a void. For example, the liner layer may be useful as an adhesion layer.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making an integrated circuit on a semiconductor substrate, comprising:

forming a first transistor having a gate over the semiconductor substrate;

forming a second transistor having a gate over the semiconductor substrate, wherein the first and second transistors share a first doped region in the semiconductor substrate between the gates of the first and second transistors;

forming a third transistor having a gate over the semiconductor substrate;

forming a fourth transistor having a gate over the semiconductor substrate, wherein the third and fourth transistors share a second doped region in the semiconductor substrate between the gates of the third and fourth transistors;

forming an insulating fill over the semiconductor substrate including the first and second doped regions with a void that runs between the first and second doped regions;

forming, in the insulting fill, a first contact hole over the first doped region and a second contact hole over the second doped region so that the first and second contact holes each have a sidewall with the void exposed;

lining the first and second holes to substantially constrict the exposed void in the sidewalls of the first and second contact holes; and removing at least a portion of the lining that is over the first and second doped regions; and filling the first and second contact holes with conductive material.

2. The method of claim 1, wherein the lining of the first and second contact holes comprises depositing undoped TEOS oxide.

3. The method of claim 2, wherein the insulating fill is doped TEOS oxide.

4. A method useful in making an integrated circuit, comprising:

providing a semiconductor substrate;

forming a first doped region in the semiconductor substrate;

forming a second doped region in the semiconductor substrate;

forming an insulating fill over the semiconductor substrate including the first and second doped regions, wherein the insulating fill is characterized as having a void between the first and second doped regions;

forming, in the insulating fill, a first contact hole over the first doped region and a second contact hole over the second doped region, where in the first and second contact holes have sidewalls with the void exposed on the sidewalls; and providing prevention means for preventing conductive material from extending between the first and second contact holes through the void.

5. The method of claim 4, wherein the providing the prevention means comprises depositing a liner of insulating material in the first and second contact holes.

6. The method of claim 5, wherein the contact holes are each further characterized as having a bottom, further comprising etching the insulating material at the bottoms of the contact holes.

7. The method of claim 6, wherein the insulating material is undoped TEOS oxide.

8. The method of claim 6, wherein the insulating material is selected from nitride, undoped silicate glass, SOG, metal oxide, and undoped TEOS oxide.

9. The method of claim 6, further comprising depositing the conductive material into the first and second holes.

10. A semiconductor device structure, comprising:

a semiconductor substrate;

a first doped region in the semiconductor substrate;

a second doped region in the semiconductor substrate;

an insulating fill over the semiconductor substrate including the first and second doped regions, wherein the insulating fill is characterized as having a void between the first and second doped regions;

a first contact hole over the first doped region and a second contact hole over the second doped region, where in the first and second contact holes are formed in the insulating fill and have sidewalls with the void exposed on the sidewalls; and prevention means, coupled to the void along the sidewalls, for preventing conductive material from extending between the first and second contact holes through the void.

11. The device structure of claim 10, wherein the prevention means comprises a liner of insulating material in the first and second contact holes.

12. The device structure of claim 11, further comprising contacts to the first and second doped regions.

13. The device structure of claim 12, wherein the insulating material is undoped TEOS oxide.

14. The method of claim 12, wherein the insulating material is selected from nitride, undoped silicate glass, SOG, metal oxide, and undoped TEOS oxide.

* * * * *